(12) United States Patent
Fujiwara et al.

(10) Patent No.: US 9,607,683 B1
(45) Date of Patent: Mar. 28, 2017

(54) EMULATOR FOR IMULATING AN OPERATION OF A SRAM

(71) Applicant: TAIWAN SEMICONDUCTOR MANUFACTURING COMPANY LTD., Hsinchu (TW)

(72) Inventors: Hidehiro Fujiwara, Hsinchu (TW); Yen-Huei Chen, Hsinchu (TW); Hung-Jen Liao, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/969,632

(22) Filed: Dec. 15, 2015

(51) Int. Cl.
*G11C 11/00* (2006.01)
*G11C 11/417* (2006.01)
*G11C 11/412* (2006.01)
*G11C 5/14* (2006.01)

(52) U.S. Cl.
CPC ............ *G11C 11/417* (2013.01); *G11C 5/147* (2013.01); *G11C 11/412* (2013.01)

(58) Field of Classification Search
CPC .................................................. G11C 11/412
USPC ......................................................... 365/156
See application file for complete search history.

(56) References Cited

U.S. PATENT DOCUMENTS 7,142,466 B1 * 11/2006 Muthalif .................. G11C 7/08
365/210.11

* cited by examiner

*Primary Examiner* — Son Mai
(74) *Attorney, Agent, or Firm* — WPAT, P.C., Intellectual Property Attorneys; Anthony King

(57) ABSTRACT

In some embodiments, a semiconductor device includes an SRAM cell, an emulator and a suppressing device. The SRAM cell, enabled by a word line, includes a first inverter formed by a first PMOS transistor and a first NMOS transistor and stores a first data at an output of the first inverter. The emulator is configured to emulate the first inverter operating in a condition that the PMOS transistor is weaker than the first NMOS transistor in driving strength. The suppressing device is configured to, in response to a voltage at an output of the emulator, selectively suppress a voltage level of the word line.

20 Claims, 14 Drawing Sheets

EMULATOR FOR IMULATING AN OPERATION OF A SRAM

BACKGROUND

Modern electronic devices such as notebook computers comprise a variety of memories to store information. Memory circuits include two major categories, volatile memories and non-volatile. Volatile memories include random access memory (RAM), which can be further divided into two sub-categories, static random access memory (SRAM) and dynamic random access memory (DRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
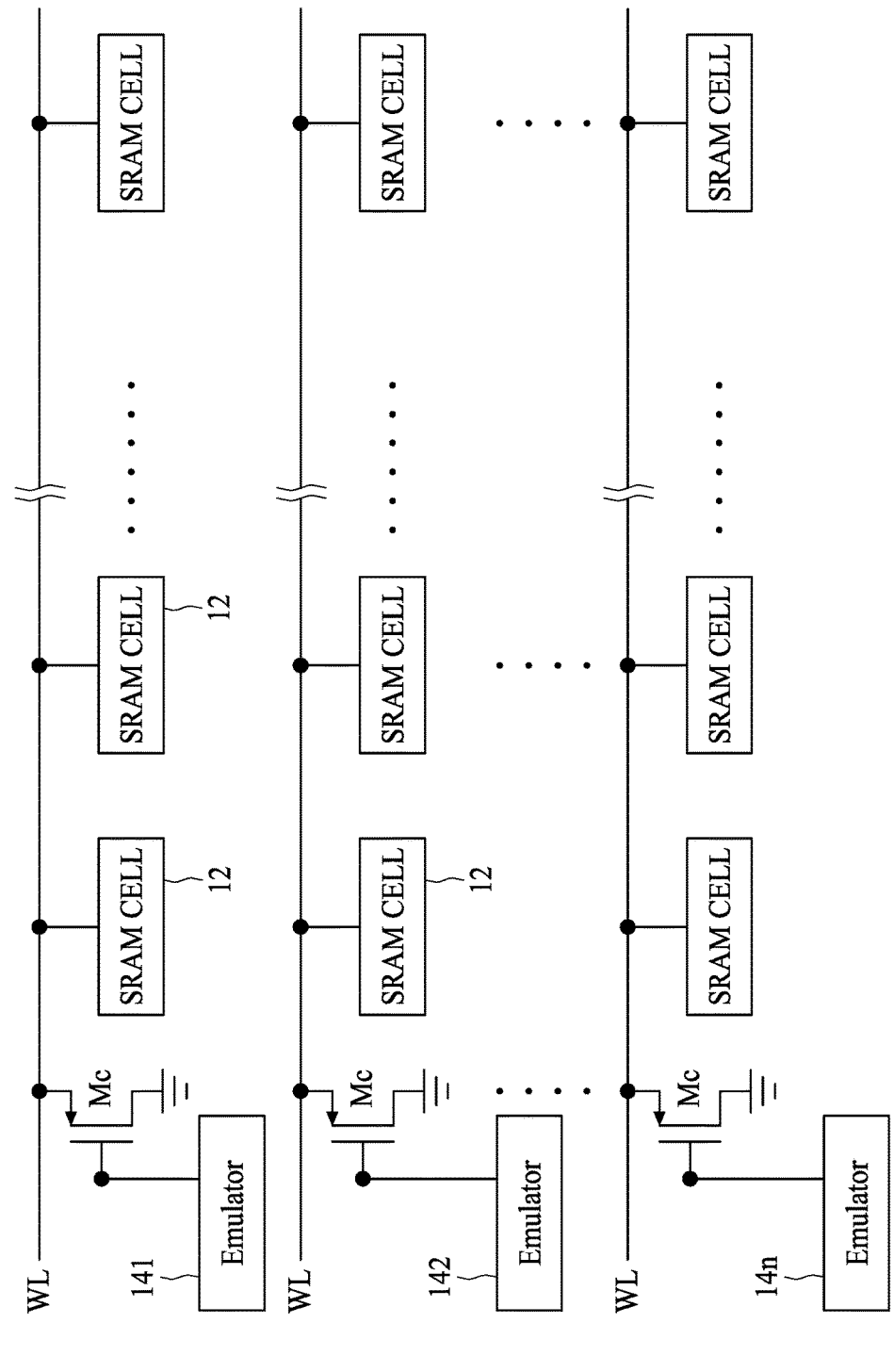
FIG. 1 is a diagram of an SRAM array, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a diagram of an SRAM array 1, in accordance with some embodiments. Referring to FIG. 1, the SRAM array 1 includes a plurality of SRAM cells 12 arranged in rows and columns, a plurality of transistors Mc and a plurality of emulators 141-14$n$, wherein n is a positive integer. The SRAM cell 12 may consist of four transistors (4T), six transistors (6T), eight transistors (8T), or ten transistors (10T).

Each row of SRAM cells 12 is enabled by a word line WL, and accompanied with an emulator, such as an exemplary emulator 141 or 142. The emulator is configured to detect a corner case of an SRAM cell in the same row. Moreover, each row of SRAM cells 12 is also accompanied with a transistor Mc, which serves as a suppressing device for, in response to a detection result, selectively suppressing a voltage level of a word line WL associated with the transistor Mc in the same row. For example, when a corner case of an SRAM cell, detected by an associated emulator in the same row of the SRAM cell, is determined to be one of a fast-to-fast (FF) corner case and a fast-to-slow (FS) corner case, the transistor Mc in the same row suppresses the voltage level of the word line WL For example, the voltage level of the suppressed word line WL ranges from approximately 5% to approximately 15% of that of the unsuppressed word line WL. Contrarily, when a corner case of an SRAM cell, detected by an associated emulator in the same row of the SRAM cell, is determined to be one of a slow-to-slow (SS) corner case and a slow-to-fast (SF) corner case, the transistor Mc in the same row does not suppress the voltage level of the word line WL.

Figure 2:
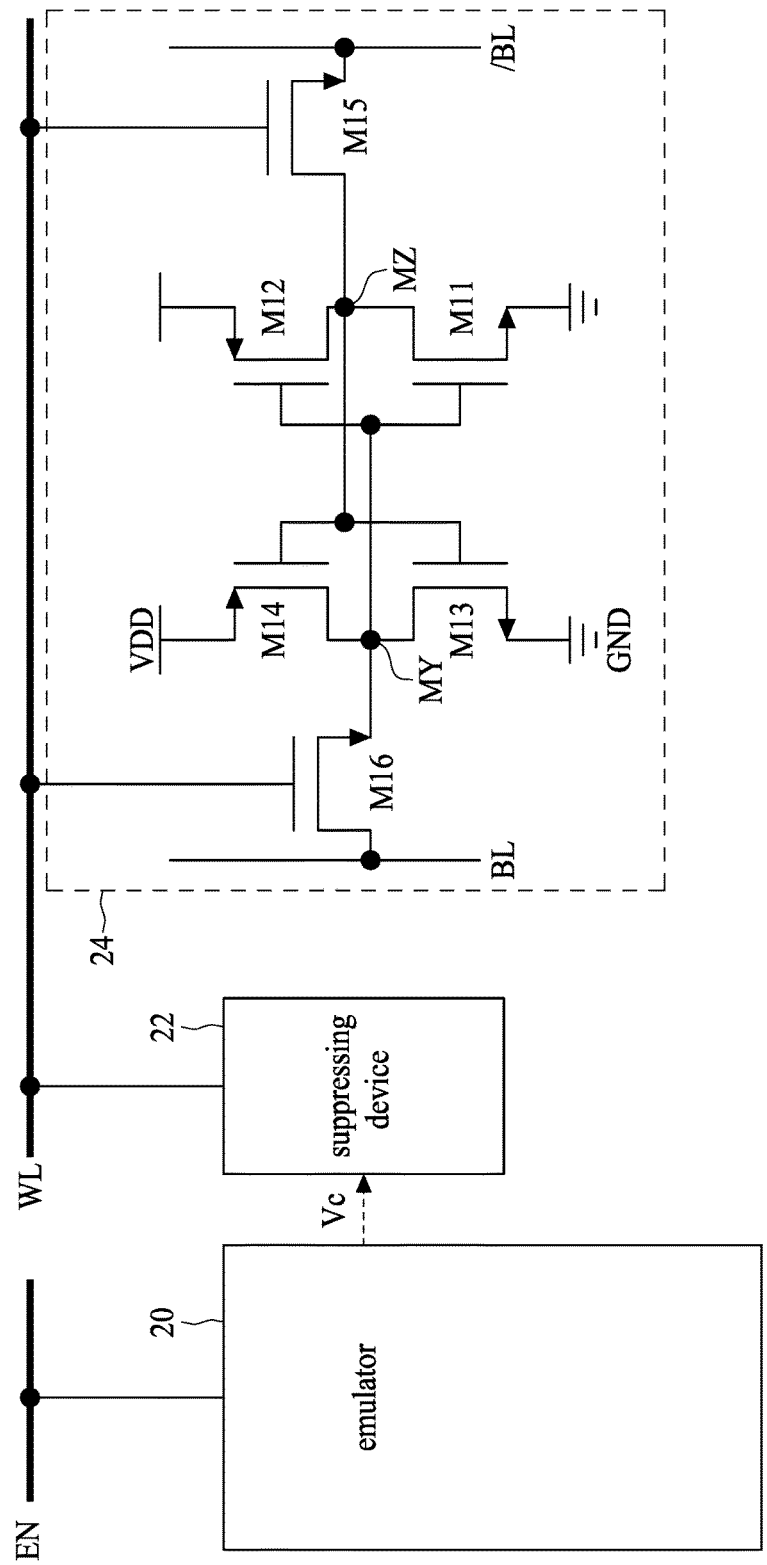
FIG. 2 is a diagram of a semiconductor device, in accordance with some embodiments.

FIG. 2 is a diagram of a semiconductor device 2, in accordance with some embodiments. Referring to FIG. 2, the semiconductor device 2 includes an emulator 20, a suppressing device 22 and an SRAM cell 24.

The SRAM cell 24, configured to be enabled by a word line WL, consists of six transistors M11, M12, M13, M14, M15 and M16. In an embodiment, each of the transistors M11, M12, M13, M14, M15 and M16 is a metal-oxide semiconductor (MOS) transistor. Specifically, the transistors M11, M13, M15 and M16 are n-type MOS (NMOS) transistors, while the transistors M12 and M14 are p-type MOS (PMOS) transistors.

A first inverter is formed by the first PMOS transistor M12 and the first NMOS transistor M11, and stores a first data at an output MZ of the first inverter. A second inverter is formed by the second PMOS transistor M14 and the second NMOS transistor M13, and stores a second data at an output MY of the second inverter. A logic level of the first data is complementary to that of the second data. The first inverter and the second inverter are cross coupled, which means that the output MZ of the first inverter is coupled to an input of the first inverter, and the output MY of the second inverter is coupled to an input of the second inverter.

In the first inverter, the first PMOS transistor M12 functions to pull up a voltage level at the output MZ toward the supply voltage VDD, while the first NMOS transistor M11 functions to pull down a voltage level at the output MZ toward a reference voltage GND.

Similarly, in the second inverter, the second PMOS transistor M14 functions to pull up a voltage level at the output MY toward the supply voltage VDD, while the second NMOS transistor M13 functions to pull down a voltage level at the output MY toward the reference voltage GND.

The transistors M16 and M15, which serve as switches or pass gates, are configured to be enabled by a first logic level (i.e. logic high) of the word line WL, such that the first inverter and the second inverter perform one of a reading operation or a writing operation. In the reading operation, a bit line BL and a bit line bar /BL are charged to the same voltage level. In the writing operation, the bit line BL and the bit line bar /BAR are charged to the opposite voltage level.

Some existing SRAM devices may suffer a data-flip issue. For convenience of interpretation, the SRAM cell 24 is regarded as the existing SRAM device. Assuming that the SRAM cell 24 initially stores a logic high value at the output MZ and a logic low value at the output MY, when data-flip occurs, the logic high value stored at the output MZ is inverted to a logic low one, and the logic low value stored at the output MY is inverted to a logic high one.

The SRAM cell 24 is more liable to the data-flip issue when the SRAM cell 24 operates in a condition that the first NMOS transistor M11 is stronger than the first PMOS transistor M12 in driving strength and the switch transistor M16 is stronger than the second NMOS transistor M13 in driving strength. Such discrepancy in driving strength between transistors results from a local variation in manufacturing process. Moreover, the driving strength of a transistor is determined by channel carrier mobility. For example, the driving strength increases as the carrier mobility increases.

Moreover, the SRAM cell 24 is susceptible to the data-flip issue when the voltage level on the word line WL is relatively high. Specifically, since when the transistor M16 is biased at a relatively high voltage on the word line WL, the voltage at the output MY is relatively high. With the relatively high voltage at the output MY, the transistor M11 is liable to be conducted. If the transistor M11 is conducted, a logic high value stored at the output MZ is inverted to a logic low value.

In order to eliminate the data-flip issue, a suppressed word line (SWL) scheme is presented. A transistor, such as the transistor Mc described and illustrated with reference to FIG. 1, is configured to suppress the voltage level on the word line WL no matter what the corner case of the SRAM cell 24 is. With the suppressed voltage level on the word line WL, the data-flip issue may be alleviated. However, the suppressed voltage level on the word line WL may slow the operation speed of the SRAM cell 24 when operating in SS or SF corner case.

Therefore, it may be desirable to determine whether the SRAM cell 24 liable to the data-flip issue is data flipped. If the data stored in the SRAM cell 24 is flipped, the voltage level at the output MZ presents logic low. Whether the data stored in the SRAM cell 24 is flipped can be determined by simulating the voltage level at the output MZ of the SRAM cell 24.

The emulator 20 is selectively enabled by an enable signal EN, which will be discussed in detail with reference to FIG. 3.

In an embodiment, the emulator 20 is configured to emulate the first inverter of the SRAM cell 24 operating in a condition that the first PMOS transistor M12 is weaker than the first NMOS transistor M11 in driving strength. The suppressing device 22 is configured to, in response to a voltage Vc at an output of the emulator 20, selectively suppress a voltage level of the word line WL.

For example, if a voltage Vc at the output of the emulator 20 presents logic low, it is determined that the data stored in the SRAM cell 24 liable to the data-flip issue is flipped. As a result, the suppressing device 22 suppresses the voltage level on the word line WL. Contrarily, if a voltage Vc at an output of the emulator 20 presents logic high, it is determined that the data stored in the SRAM cell 24 liable to the data-flip issue is not flipped. Consequently, the suppressing device 22 does not suppress the voltage level on the word line WL.

In another embodiment, the emulator 20 is configured to emulate the second inverter operating in a condition that the switch transistor M16 is stronger than the second NMOS transistor M13 in driving strength. Similarly, the suppressing device 22 is configured to, in response to the voltage Vc at the output of the emulator 20, selectively suppress the voltage level of the word line WL.

In still another embodiment, the emulator 20 is configured to emulate the first inverter operating in a condition that the first PMOS transistor M12 is weaker than the first NMOS transistor M11 in driving strength, and emulate the second inverter operating in a condition that the switch transistor M16 is stronger than the second NMOS transistor M13 in driving strength. Similarly, the suppressing device 22 is configured to, in response to the voltage Vc at the output of the emulator 20, selectively suppress the voltage level of the word line WL.

Figure 3:
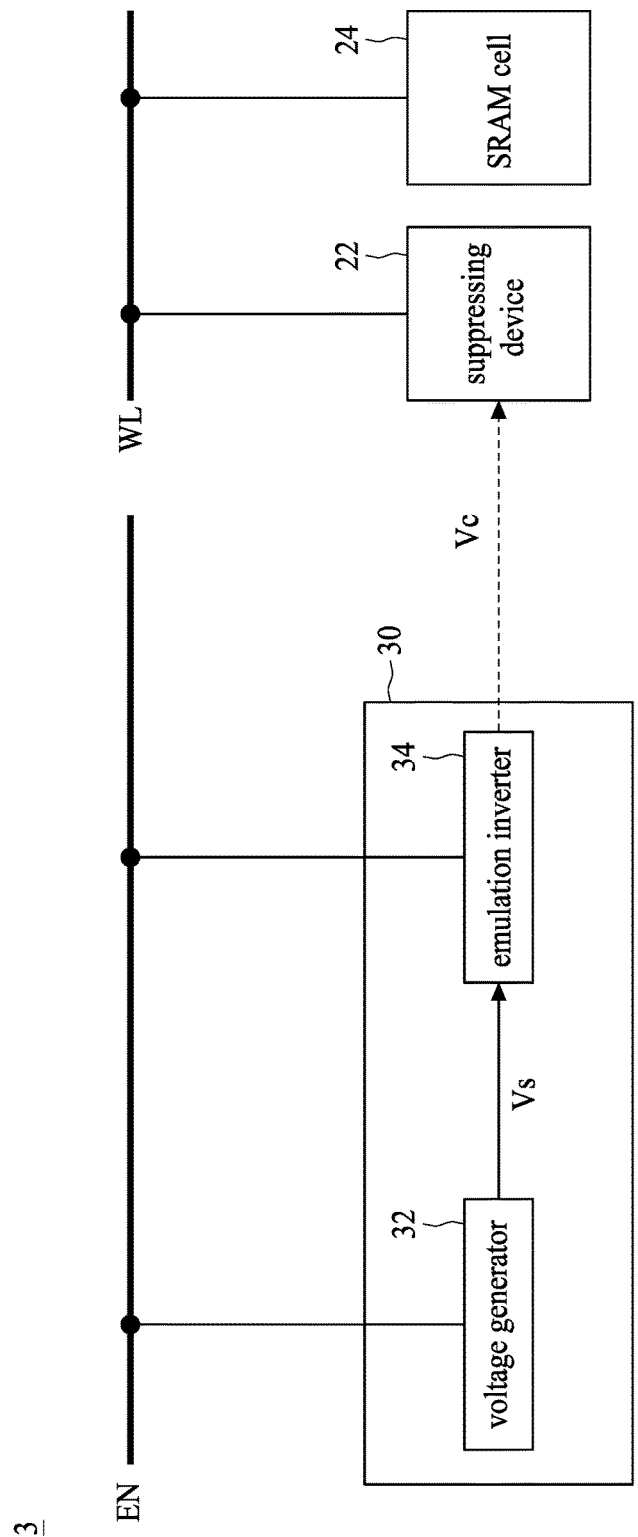
FIG. 3 is a block diagram of a semiconductor device, in accordance with some embodiments.

FIG. 3 is a block diagram of a semiconductor device 3, in accordance with some embodiments. Referring to FIG. 3, the semiconductor device 3 is similar to the semiconductor device 2 except that, for example, the semiconductor device 3 includes an emulator 30 including a voltage generator 32 and an emulation inverter 34. Both the voltage generator 32 and the emulation inverter 34 are enabled by a first logic level (i.e. logic high) of an enable signal EN.

The voltage generator 32 is configured to, in response to the first logic level of the enable signal EN, provide an input of the emulation inverter 34 with a stage voltage Vs. The stage voltage Vs is a predetermined percentage of the supply voltage VDD. For example, the predetermined percentage is less than about 50%. Alternatively, the predetermined percentage ranges from about 20% to about 40%. Moreover, the voltage generator 32 is configured to be enabled by the first logic level of the enable signal EN, and to be disabled by a second logic level opposite to the first logic level of the enable signal EN.

Also referring to FIG. 2, when the SRAM cell 24 operates in a condition that the switch transistor M16 is stronger than the second NMOS transistor M13 in driving strength, as previously discussed, the SRAM cell 24 is liable to the data-flip issue. In operation, assuming that initially the voltage at the output MZ is logically high and the voltage at the output MY is logically low, at a transient moment as the associated word line WL is asserted, both transistors M14 and M13 are turned on. In the SRAM cell 24, the voltage at the output MY of the second inverter approaches the predetermined percentage of the supply voltage VDD.

Therefore, the stage voltage Vs output by the voltage generator 32 is able to simulate the voltage output at the second inverter of the SRAM cell 24 operating in the condition that the switch transistor M16 is stronger than the second NMOS transistor M13 in driving strength. The stage voltage Vs generated by the voltage generator 32 assists in determining the corner case of the SRAM cell 24.

The emulation inverter 34 is configured to emulate the first inverter operating in a condition that the first PMOS transistor M12 is weaker than the first NMOS transistor M11 in driving strength. Since the emulation inverter 34 is configured to emulate the first inverter operating in the above condition, an operation of the emulation inverter 34 is similar to that of the first inverter operating in the above condition.

Based on the similar stage voltage Vs and the similar operation, the voltage Vc output by the emulation inverter 34 is useable to determine whether the data stored in the SRAM cell 24 is flipped. Subsequently, the suppressing device 22, in response to the voltage Vc at the output of the emulation inverter 34, selectively suppresses the voltage level of the word line WL.

Figure 4A:
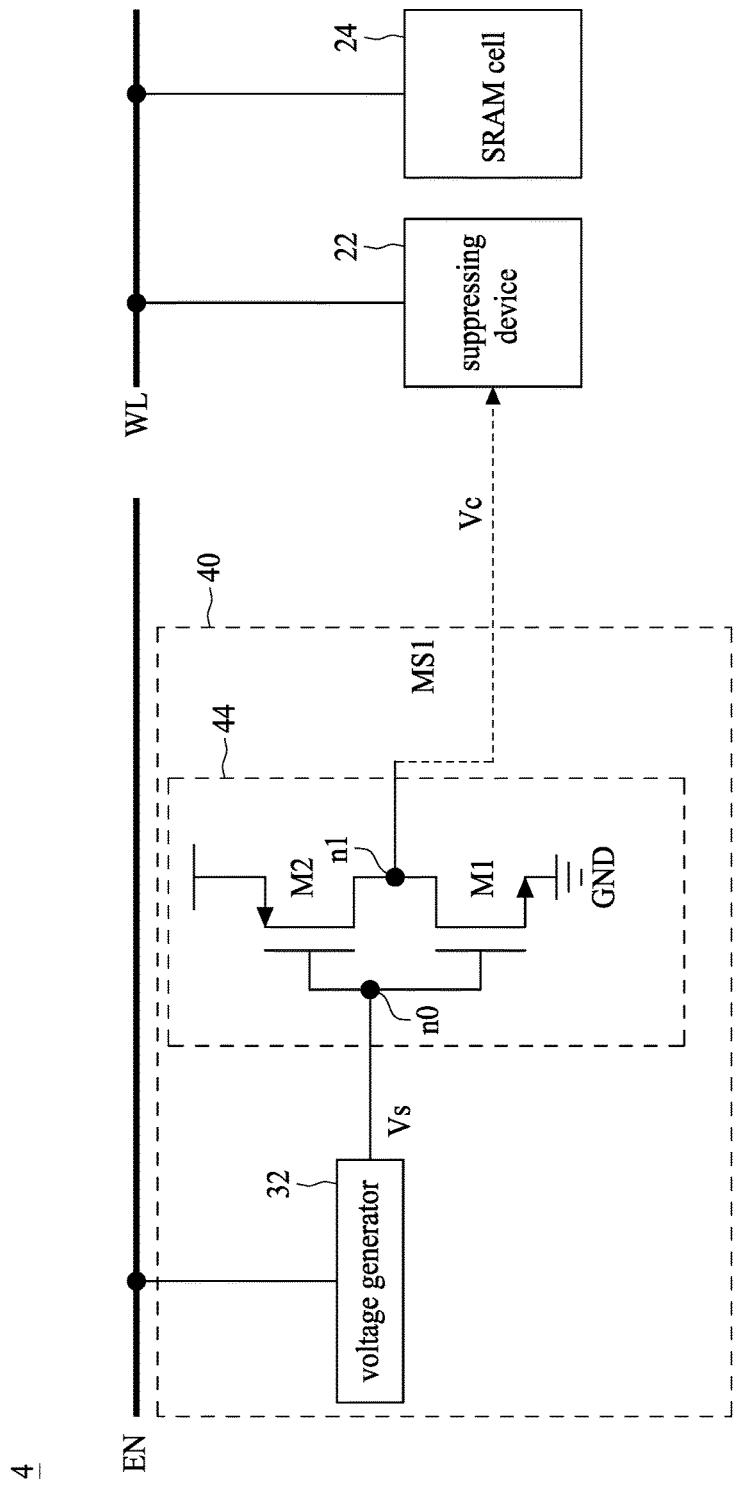
FIG. 4A is a diagram of a semiconductor device, in accordance with some embodiments.

FIG. 4A is a diagram of a semiconductor device 4, in accordance with some embodiments. Referring to FIG. 4A, the semiconductor device 4 is similar to the semiconductor device 3 described and illustrated with reference to FIG. 3 except that, for example, the semiconductor device 4 includes an emulator 40 including an emulation inverter 44.

The emulation inverter 44 includes a high-side transistor M2 and a low-side transistor M1. The high-side transistor M2 includes a p-type MOS (PMOS) transistor and corresponds to the first PMOS transistor M12 of the SRAM cell 24, and the low-side transistor M1 includes an n-type MOS (NMOS) transistor, and corresponds to the first NMOS transistor 11 of the SRAM cell 24. The high-side transistor M2 and the low-side transistor M1 have a connection node (i.e. node n1) between drain terminals of each of the high-side transistor M2 and the low-side transistor M1, serving as the output of the emulation inverter 44. The low-side transistor M1 is stronger than the high-side transistor M2 in driving strength. Relationship in driving strength between the high-side transistor M2 and the low-side transistor M1 is similar to that between the first NMOS transistor M11 and the first PMOS transistor M12 of the SRAM cell 24. Therefore, the operation of the high-side transistor M2 and the low-side transistor M1 is similar to that of the first NMOS transistor M11 and the first PMOS transistor M12 of the SRAM cell 24.

Based on the similar stage voltage Vs received at a node n0 serving as an input of the first inverter and the similar circuit structure formed by the high-side transistor M2 and the low-side transistor M1, the voltage at node n1 serving as an output of the emulation inverter 44 is useable to determine whether the data stored in the SRAM cell 24 is flipped. Subsequently, the suppressing device 22, in response to the voltage Vc at the output of the emulation inverter 24, selectively suppresses the voltage level of the word line WL.

In an embodiment, the low-side transistor M1 has an aspect ratio greater than that of the high-side transistor M2, and therefore the low-side transistor M1 is stronger than the high-side transistor M2 in driving strength.

In another embodiment, the low-side transistor M1 has a threshold voltage lower than that of the high-side transistor M2, and therefore the low-side transistor M1 is stronger than the high-side transistor M2 in driving strength.

In still another embodiment, the low-side transistor M1 has an aspect ratio greater than that of the high-side transistor M2 and has a threshold voltage lower than that of the high-side transistor M2, and therefore the low-side transistor M1 is stronger than the high-side transistor M2 in driving strength.

Figure 4B:
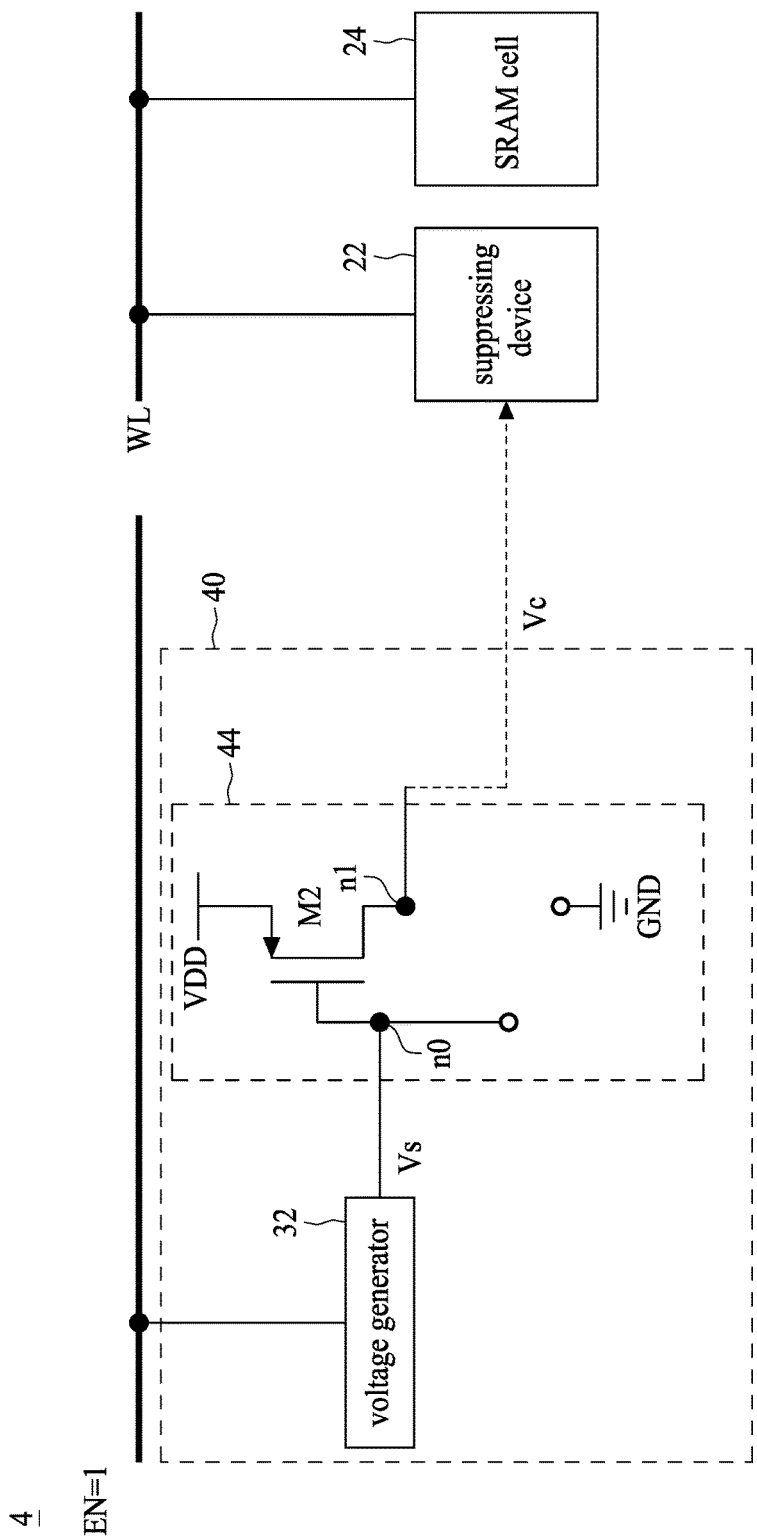
FIG. 4B is a schematic diagram illustrating an operation of an emulation inverter of FIG. 4A, in accordance with some embodiments.

FIG. 4B is a schematic diagram illustrating an operation of the emulation inverter 44 of FIG. 4A, in accordance with some embodiments. Referring to FIG. 4B, the voltage generator 32, in response to the first logic level of the enable signal EN (i.e. EN=1), is enabled and provides the stage voltage Vs to the emulation inverter 44. At that moment, the low-side transistor M1 is not conducted, while the high-side transistor M2 is conducted. The voltage Vc at node n1 serving as the output of the emulation inverter 44 is pulled up to a voltage close to the supply voltage VDD. The suppressing device 22, in response to the voltage Vc, does not suppress the voltage level of the word line WL.

Figure 4C:
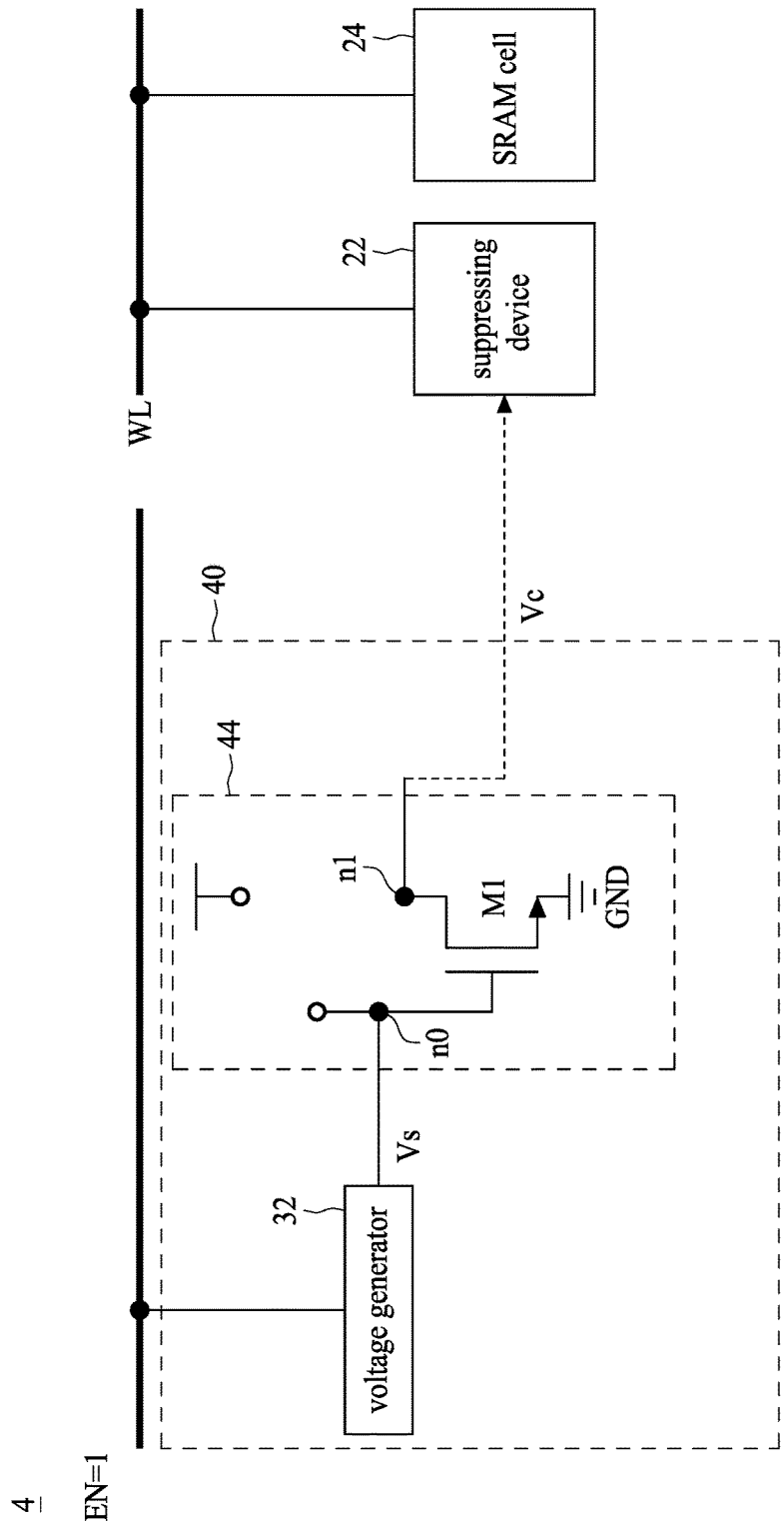
FIG. 4C is a schematic diagram illustrating another operation of the emulation inverter of FIG. 4A, in accordance with some embodiments.

FIG. 4C is a schematic diagram illustrating another operation of the emulation inverter 44 of FIG. 4A, in accordance with some embodiments. Referring to FIG. 4C, the voltage generator 32, in response to the first logic level of the enable signal EN (i.e. EN=1), is enabled and provides the stage voltage Vs to the emulation inverter 44. At that moment, the low-side transistor M1 is conducted, while the high-side transistor M2 is not conducted. The voltage Vc at node n1 is pulled down to a voltage close to the reference voltage GND. The suppressing device 22, in response to the voltage Vc, suppresses the voltage level of the word line WL.

Figure 5:
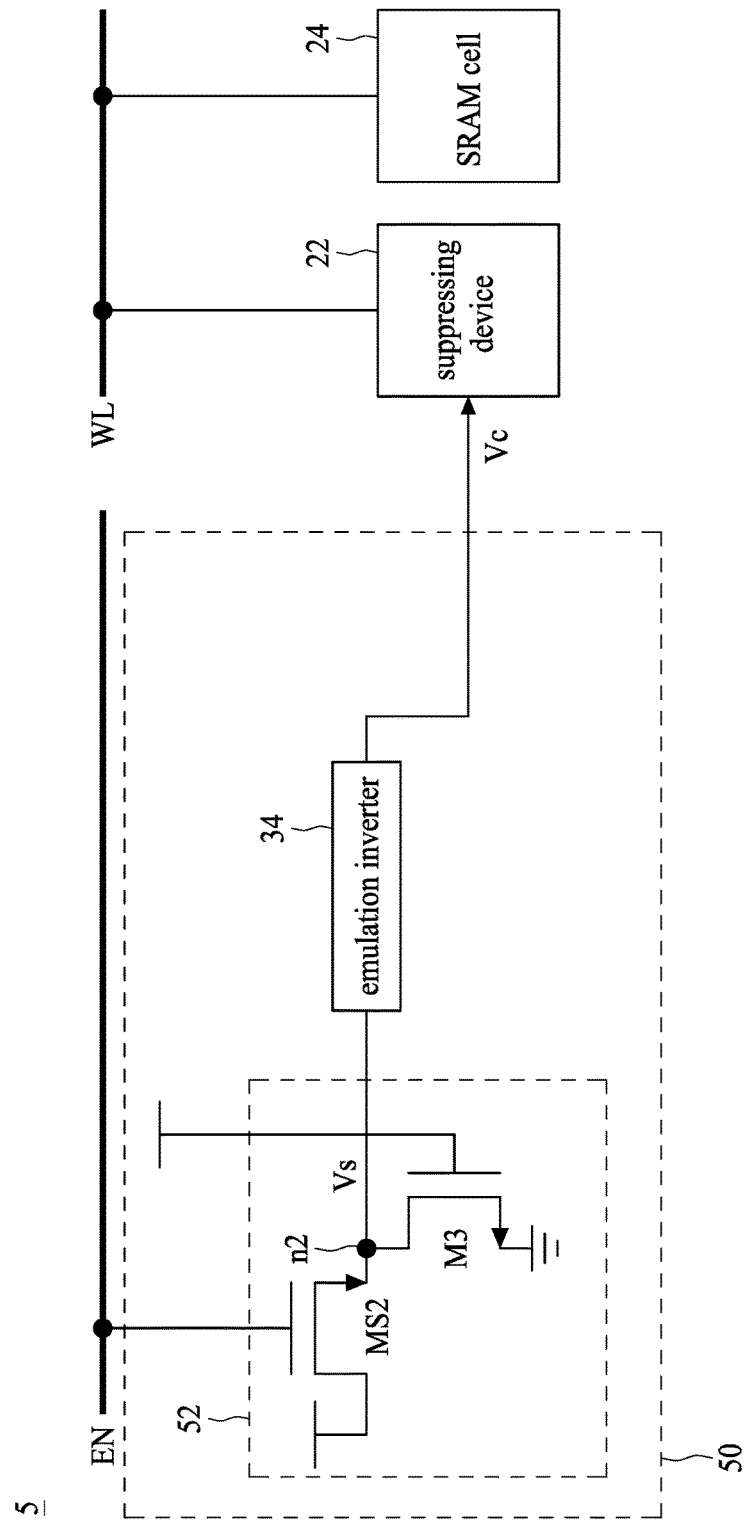
FIG. 5 is a diagram of a semiconductor device, in accordance with some embodiments.

FIG. 5 is a diagram of a semiconductor device 5, in accordance with some embodiments. Referring to FIG. 5, the semiconductor device 5 is similar to the semiconductor device 3 described and illustrated with reference to FIG. 3 except that, for example, the semiconductor device 5 includes an emulator 50 including a voltage generator 52.

The voltage generator 52 includes a first resistive transistor MS2 and a second resistive transistor M3. The first resistive transistor MS2 includes an n-type MOS (NMOS) transistor similar to the switch transistor M16 of the SRAM cell 24. The second resistive transistor M3 includes an n-type MOS (NMOS) transistor similar to the second NMOS transistor M13.

A gate of the first resistive transistor MS2 is biased at the enable signal EN. The first resistive transistor MS2 is configured to be conducted in response to the first logic level (i.e. high logic level) of the enable signal EN, and the voltage generator 52 accordingly provides the stage voltage Vs. Contrarily, the first resistive transistor MS2 is configured to be not conducted in response to the second logic level complementary to the first logic level. Moreover, a gate of the second resistive transistor M3 is biased at the supply voltage VDD. Therefore, the second resistive transistor M3 is configured to, in response to the second logic level, initiate a voltage at the input of the emulation inverter 34 (i.e. a voltage at node n2) as the reference voltage GND.

Moreover, the first resistive transistor MS2 is stronger than the second resistive transistor M3 in driving strength. Relationship in driving strength between the first resistive transistor MS2 and the second resistive transistor M3 is similar to that between the switch transistor M16 and the second NMOS transistor M13 of the SRAM cell 24. Therefore, the operation of the first resistive transistor MS2 and the second resistive transistor M3 is similar to that of the switch transistor M16 and the second NMOS transistor M13 of the SRAM cell 24.

Based on the similar circuit structure formed by the first resistive transistor MS2 and the second resistive transistor M3 and the similar operation, the stage voltage Vs provided at node n2 is similar to a voltage at the output MY of the second inverter of the SRAM cell 24. In addition, based on the similar stage voltage Vs received at node n2 serving as an input of the emulation inverter 34, the voltage Vc is useable to determine whether the data stored in the SRAM cell 24 is flipped. Subsequently, the suppressing device 22, in response to the voltage Vc at the output of the emulation inverter 34, selectively suppresses the voltage level of the word line WL.

Figure 6:
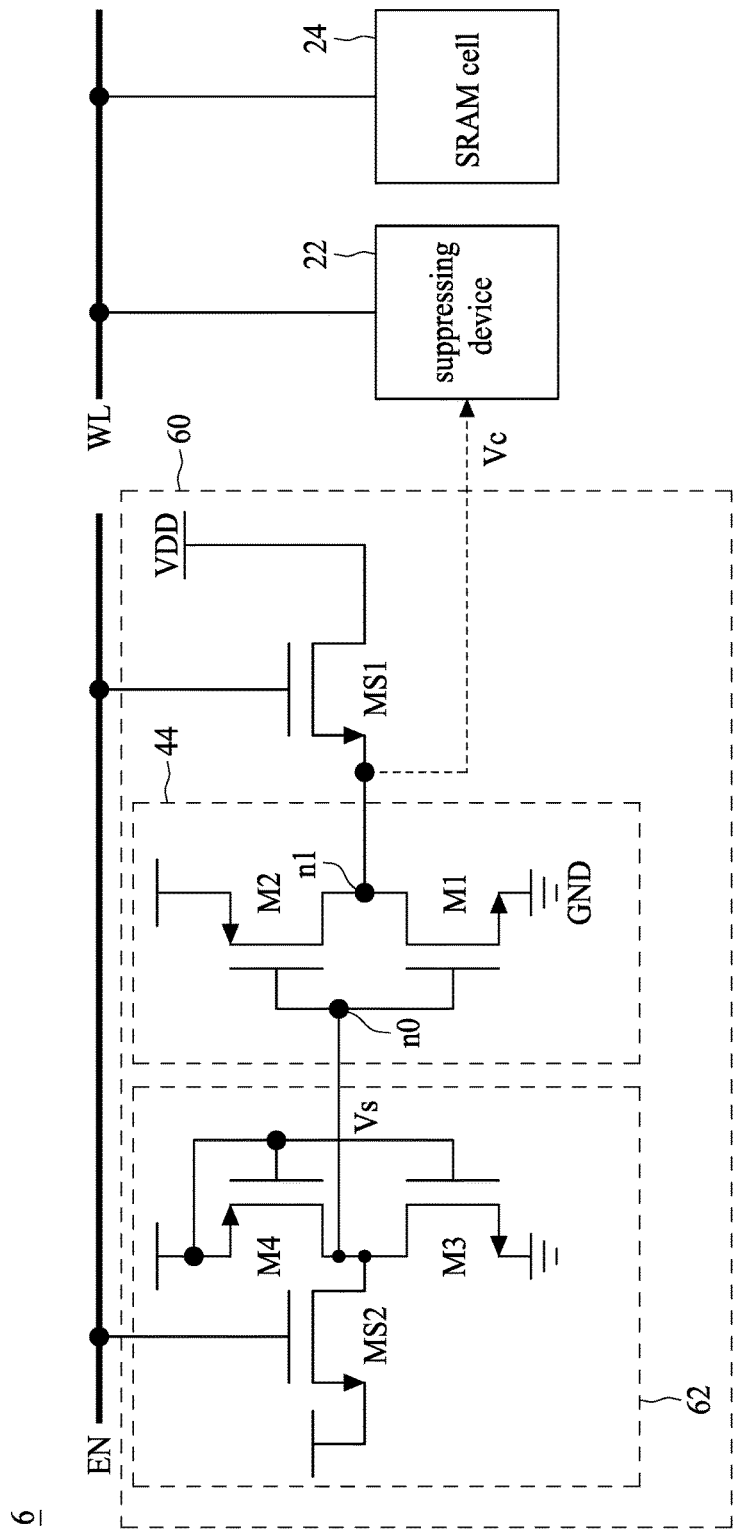
FIG. 6 is a diagram of a semiconductor device, in accordance with some embodiments.

FIG. 6 is a diagram of a semiconductor device 6, in accordance with some embodiments. Referring to FIG. 6, the semiconductor device 6 is similar to the semiconductor device 4 described and illustrated with reference to FIG. 4A except that the semiconductor device 6 includes an emulator 60 including a voltage generator 62 and a transistor MS1.

The voltage generator 62 is similar to the voltage generator 52 described and illustrated with reference to FIG. 5 except that, for example, the voltage generator 62 further includes a transistor M4. The operation of the voltage generator 62 is similar to that of the voltage generator 52, because each of a drain and a gate of the transistor M4 is coupled to the supply voltage VDD, and therefore the transistor M4 is kept not conducted. The voltage generator 62 is also able to provide the stage voltage Vs to the emulation inverter 44.

The operation of the emulation inverter 44 is similar to the operation as described in the embodiments of FIGS. 4A-4C except that, for example, a circumstance that the low-side transistor M1 is conducted. When the low-side transistor M1 is conducted, the low-side transistor M1 and the transistor MS1 establish a current path from the supply voltage VDD to the reference voltage GND. Accordingly, the voltage Vc at node n1 is not ideally equal to logic low, but is still sufficient to determine whether the data stored in the SRAM cell 24 is flipped.

Figure 7A:
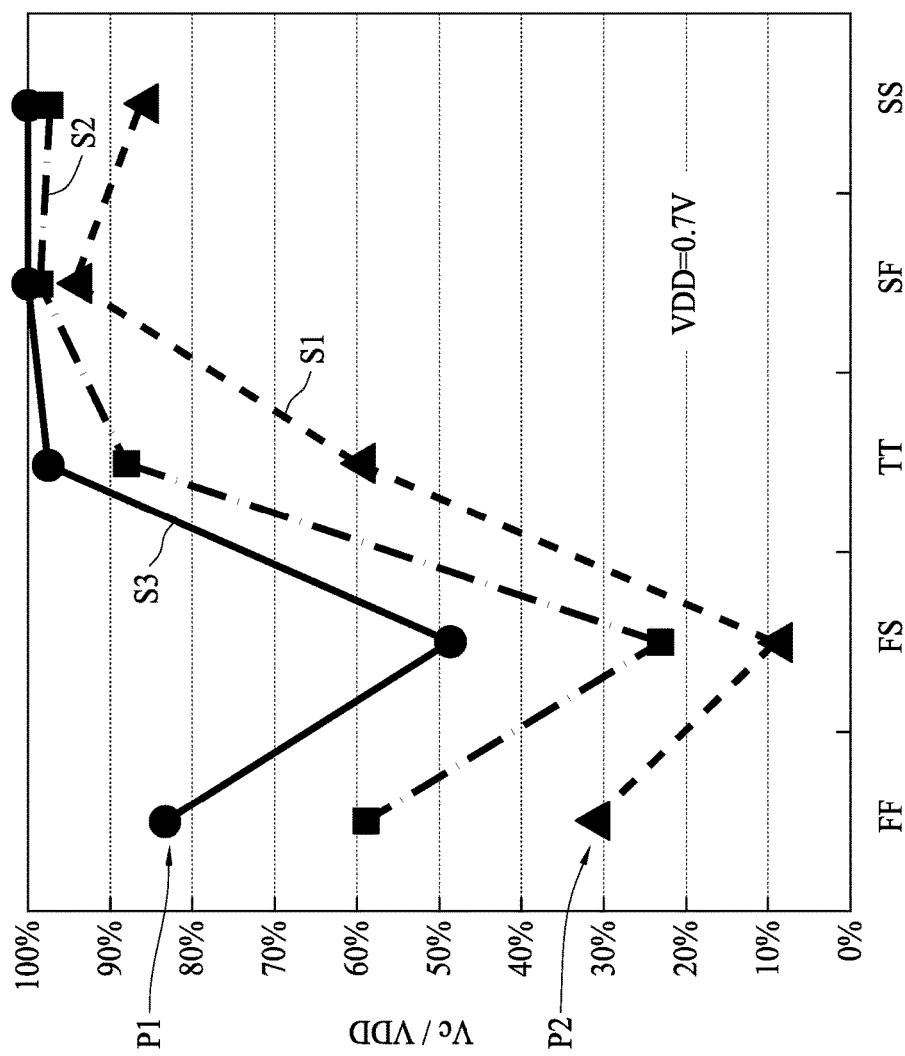
FIG. 7A is a diagram showing voltage characteristics, in accordance with some embodiments.

FIG. 7A is a diagram showing voltage characteristics of the voltage Vc output by the emulator 60 powered by a supply voltage VDD of 0.7 Volt (V) described and illustrated with reference to FIG. 6, in accordance with some embodiments. Referring to FIG. 7A, the horizontal axis represents the corner case of the SRAM cell 24 liable to the data-flip issue, and the vertical axis represents a percentage of the voltage Vc to the supply voltage VDD. Moreover, the label "TT" represents typical-to-typical (TT) corner case. Curve S1 represents a voltage characteristic of the voltage Vc output by the emulator 60 operating at a temperature of approximately 85 Celsius degree (° C.). Curve S2 represents a voltage characteristic of the voltage Vc output by the emulator 60 operating at a temperature of approximately 25° C. Curve S3 represents a voltage characteristic of the voltage Vc output by the emulator 60 operating at a temperature of approximately −25° C. Based on the curves S1, S2 and S3, the percentage decreases as the temperature increases.

Moreover, when the percentage of the voltage Vc over the supply voltage VDD is below a predetermined percentage, such as 50%, the corner case of the SRAM cell 24 liable to the data-flip issue is detected as an FF or FS corner case.

Furthermore, when the SRAM cell 24 operates in a relatively low temperature, the data-flip issue does not occur although the SRAM cell 24 liable to the data-flip issue operates in the FF or FS corner case. Therefore, there is no need to suppress the voltage level of the word line WL. Referring back to FIG. 7A, a percentage corresponding to −25° C. at a point P1 is higher than a percentage corresponding to 85° C. at a point P2. In that case, the suppressing device 22 is able to, in response to a voltage corresponding to −25° C., not suppress the voltage level of the word line WL. Contrarily, the suppressing device 22 is able to, in response to a voltage corresponding to 85° C., suppress the voltage level of the word line WL. Effectively, the emulator 60 can control the suppressing device 22 to suppress the voltage level of the word line WL when the emulator 60 detects that the SRAM cell 24 liable to the data-flip issue operates in a group of FF and FS corner case at a relatively high temperature.

Moreover, the voltage Vc relates to an aspect ratio of each of transistors M1, M2, M3 and MS2. If the aspect ratio is changed, the voltage characteristic of the voltage Vc changes. Referring back to FIG. 1, if the voltage characteristic of the voltage Vc of the emulator 141 is different from that of the emulator 142, since the emulator 142 can provide a different simulation result, accuracy of operation on the SRAM array 1 accordingly increases.

Figure 7B:
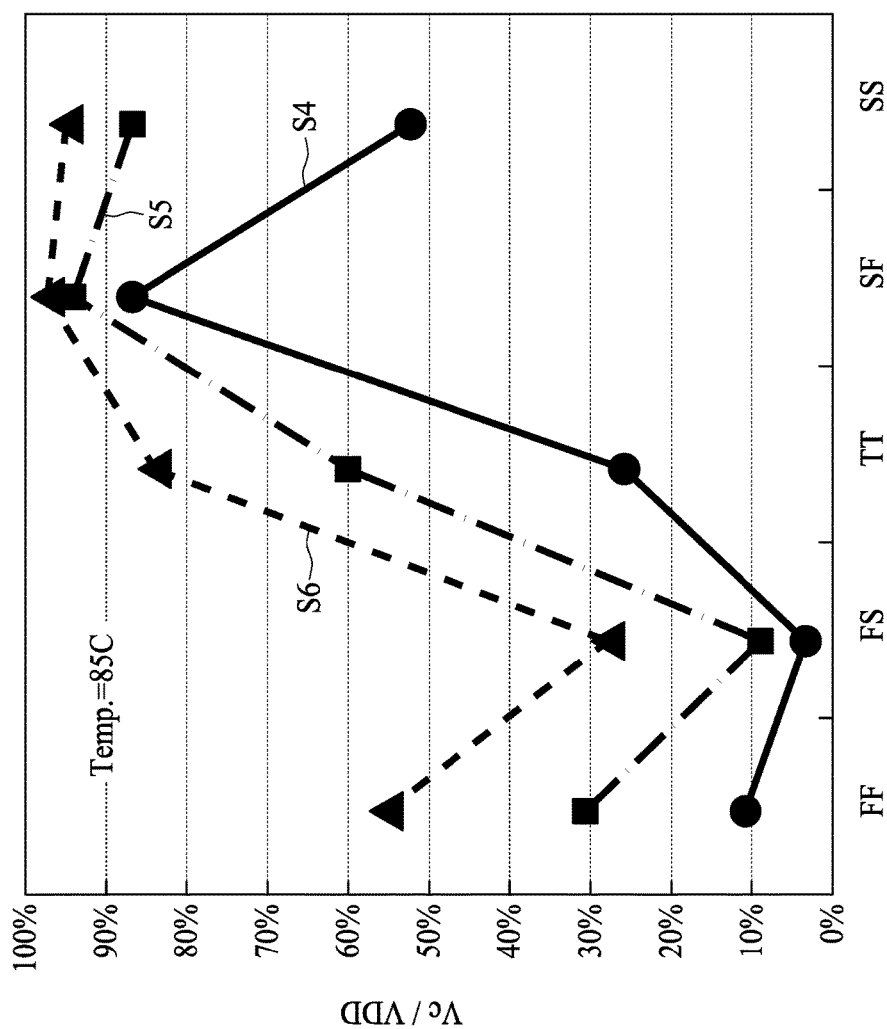
FIG. 7B is a diagram showing voltage characteristics, in accordance with some embodiments.

FIG. 7B is a diagram showing voltage characteristics of the voltage Vc output by the emulator 60 operating at approximately 85° C. described and illustrated with reference to FIG. 6, in accordance with some embodiments. Referring to FIG. 7B, curve S4 represents a voltage characteristic of the voltage Vc output by the emulator 60 powered by the supply voltage of 0.63 V. Curve S5 represents a voltage characteristic of the voltage Vc output by the emulator 60 powered by the supply voltage of 0.70 V. Curve S6 represents a voltage characteristic of the voltage Vc output by the emulator 60 powered by the supply voltage of 0.77 V. Based on the curves S4, S5 and S6, the percentage increases as the supply voltage increases.

When the SRAM cell 24 operates at the relatively high supply voltage VDD, the data-flip issue does not occur although the SRAM cell 24 liable to the data-flip issue operates in an FF or FS corner case. Therefore, there is no need to suppress the voltage level of the word line WL. For the similar reasons as provided in the embodiment of FIG. 7A, the suppressing device 22 is able to, in response to a voltage corresponding to the supply voltage VDD of 0.77 V, not suppress the voltage level of the word line WL. Contrarily, the suppressing device 22 is able to, in response to a voltage corresponding to the supply voltage VDD of 0.63 V, suppress the voltage level of the word line WL. Effectively, the emulator 60 can control the suppressing device 22 to suppress the voltage level of the word line WL when the emulator 60 detects that the SRAM cell 24 liable to the data-flipped issue operates in a group of FF and FS corner case and a relatively low voltage.

Figure 8:
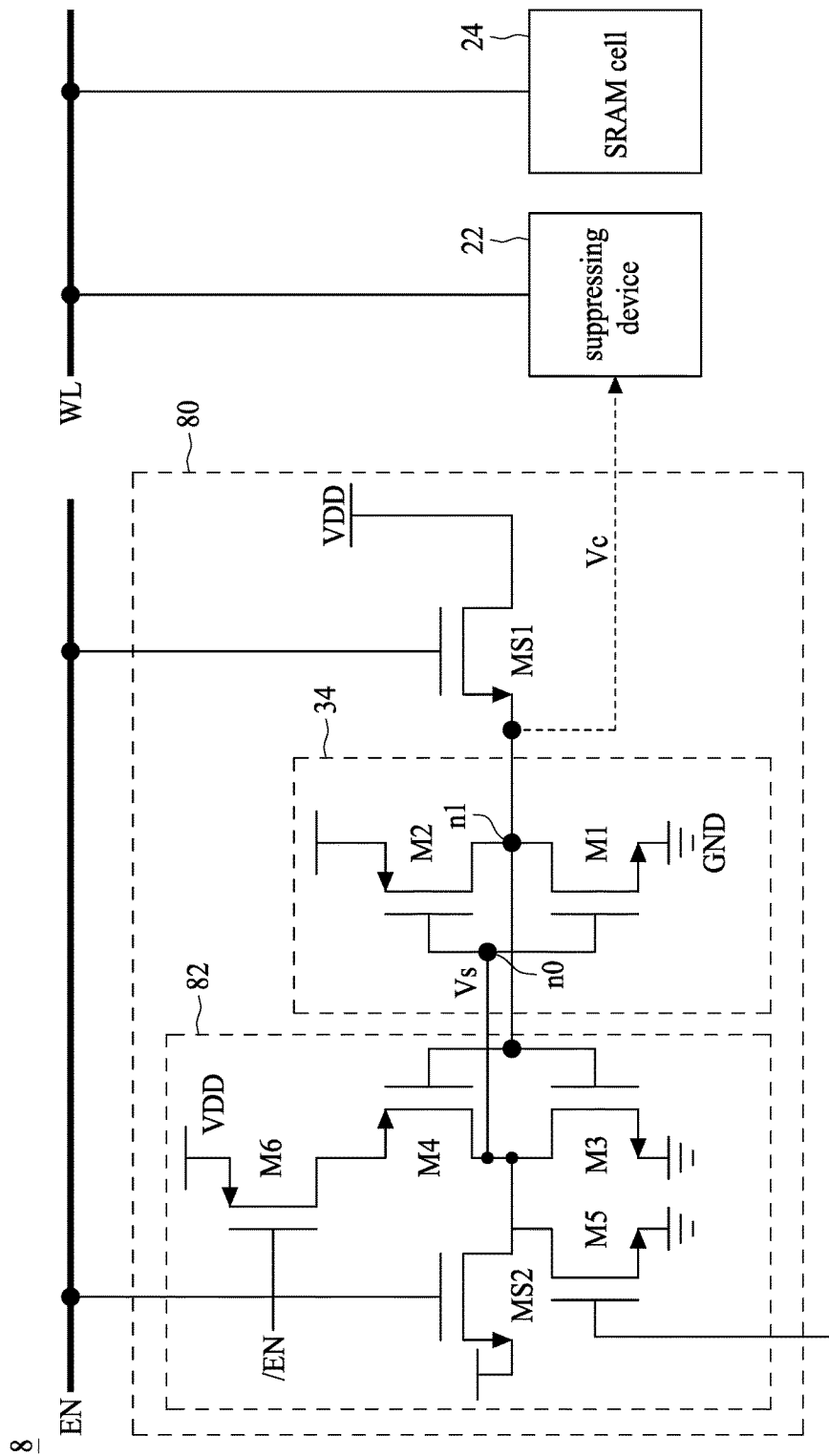
FIG. 8 is a diagram of a semiconductor device, in accordance with some embodiments.

FIG. 8 is a diagram of a semiconductor device 8, in accordance with some embodiments. Referring to FIG. 8, the semiconductor device 8 is similar to the semiconductor device 6 described and illustrated with reference to FIG. 6 except that, for example, the semiconductor device 8 includes an emulator 80 including a voltage generator 82.

In addition to the enable signal EN, the voltage generator 82 is also controlled by an enable bar signal /EN. A logic level of the enable bar signal /EN is complementary to that of the enable signal EN. When the enable signal EN provides the first logic level (i.e. logic high), the enable bar signal /EN provides the second logic level (i.e. logic low), and vice versa.

The voltage generator 82 is similar to the voltage generator 62 described and illustrated with reference to FIG. 6 except that, for example, the voltage generator 82 further includes transistors M5 and M6, and a connection of the transistor M4 and the second resistive transistor M3.

The transistor M6 is configured to, in response to the second logic level (i.e. logic low), be conducted. As a result, the transistor M4 and the second resistive transistor M3 form an inverter. Moreover, an input of the inverter is coupled to node n1 of the emulation inverter 34, and an output of the inverter is coupled to node n0 of the emulation inverter 34.

In an initial stage of conduction of the transistor M6 and the first resistive transistor MS2, the bias condition of the transistor M6 and the first resistive transistor MS2 is similar to that described and illustrated in the embodiment of FIG. 5, and therefore the voltage generator 82 is able to provide the stage voltage Vs, such that the emulation inverter 34 provides the voltage Vc useable to determine whether the data stored in the SRAM cell 24 is flipped.

Subsequently, if the voltage Vc at node n1 is not flipped and kept logic high, the second resistive transistor M3 is conducted and the transistor M4 is not conducted. Contrarily, if the voltage Vc at node n1 is flipped and inverted to logic low, the second resistive transistor M3 is not conducted and the transistors M4 and M6 pull up the voltage at node n0 toward the supply voltage VDD.

The transistor M5 is configured to be conducted in response to the first logic level (i.e. logic high) and initiates the voltage at node n0 as the reference voltage GND.

Figure 9:
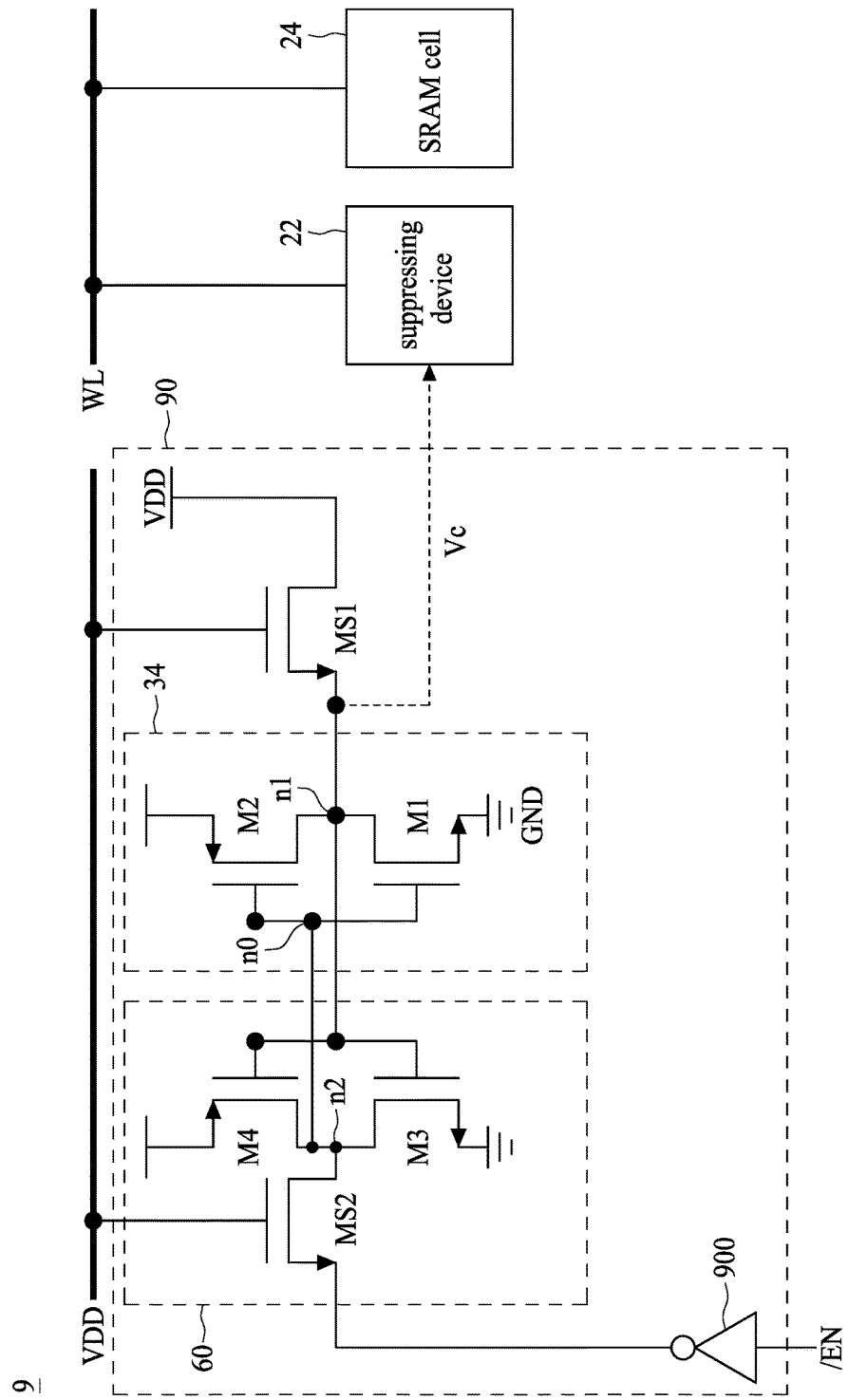
FIG. 9 is a diagram of a semiconductor device, in accordance with some embodiments.

FIG. 9 is a diagram of a semiconductor device 9, in accordance with some embodiments. Referring to FIG. 9, the semiconductor device 9 is similar to the semiconductor device 6 described and illustrated with reference to FIG. 6 except that, for example, the semiconductor device 9 includes an emulator 90 that further includes an inverter 900, and each gate of the first resistive transistor MS2 and the transistor MS1 is biased at the supply voltage VDD rather than the enable signal EN. The inverter 900 is configured to invert a logic level of the enable signal EN.

When the first resistive transistor MS2 receives the first logic level, the voltage generator 60, the emulation inverter 34 and the transistor MS1 have the same operation as described in the embodiment of FIG. 6. Accordingly, the voltage generator 60 is able to provide the stage voltage Vs, such that the emulation inverter 34 provides the voltage Vc useable to determine whether the data stored in the SRAM cell 24 is flipped.

If the data is flipped, the voltage at node n2 is pulled up toward the supply voltage VDD. The first resistive transistor MS2 is configured to, in response to the second logic level, initiate the voltage at node n2 as the reference voltage GND when the first resistive transistor MS2 is not conducted in response to the second logic level.

Figure 10:
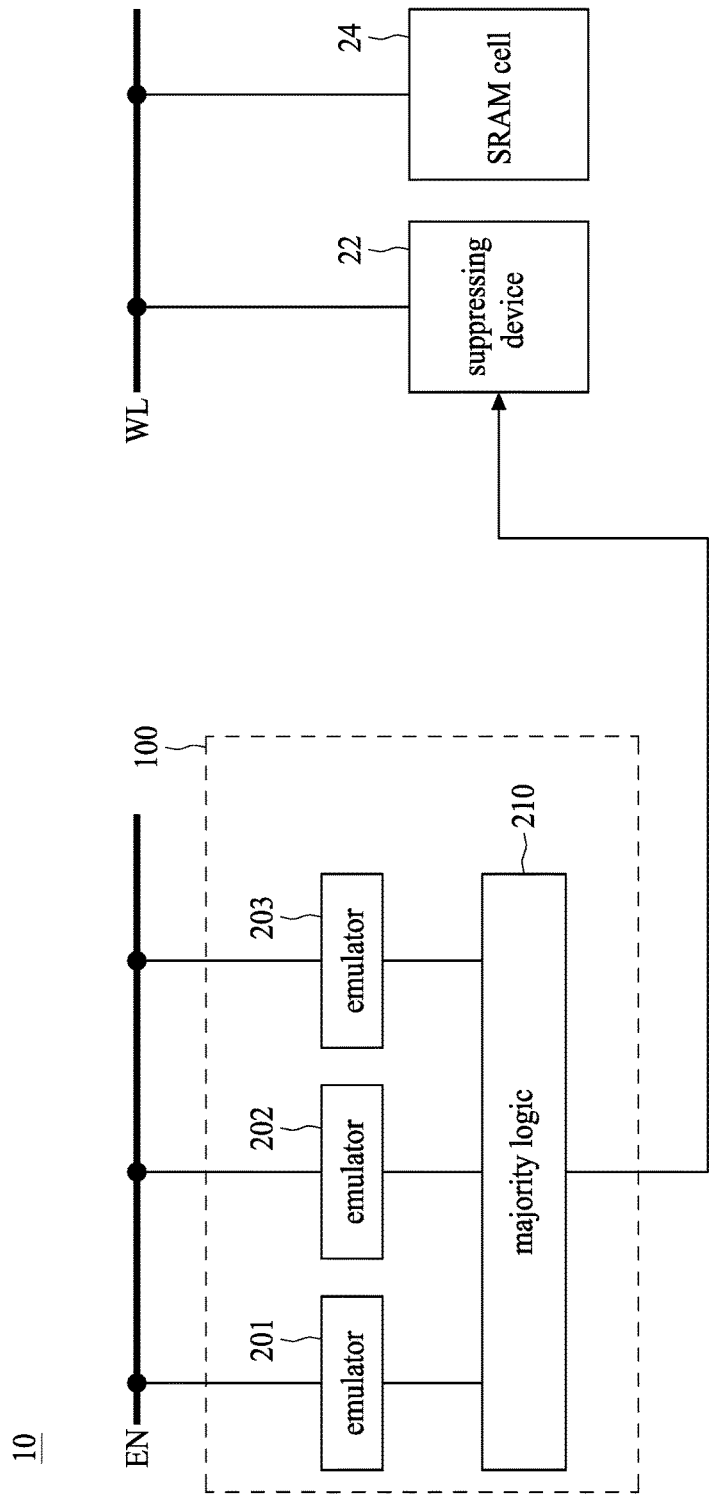
FIG. 10 is a diagram of a semiconductor device, in accordance with some embodiments.

FIG. 10 is a diagram of a semiconductor device 10, in accordance with some embodiments. The semiconductor device 10 is similar to the semiconductor device 2 except that, for example, the semiconductor device 10 includes an emulator device 100.

The emulator device 100 includes a plurality of emulators 201, 202 and 203, and a majority logic 210. Each of emulators 201, 202 and 203 may be implemented with the emulators described in the above-mentioned embodiments.

The majority logic 210 is configured to receive a simulation result (i.e. the voltage Vc) from each of the emulators 201, 202 and 203, and output a majority one of the simulation result. For example, if the emulator 201 outputs a voltage Vc with logic low but the emulators 202 and 203 output a voltage Vc with logic high, the majority logic 210 outputs a voltage with logic high to the suppressing device 22. Alternatively, if the emulator 201 outputs a voltage Vc with logic high but the emulators 202 and 203 output a voltage Vc with logic low, the majority logic 210 outputs a voltage with logic low to the suppressing device 22. In this way, accuracy of the simulation for determining whether the data stored in the SRAM cell 24 liable to the data-flip issue is flipped is enhanced.

Figure 11:
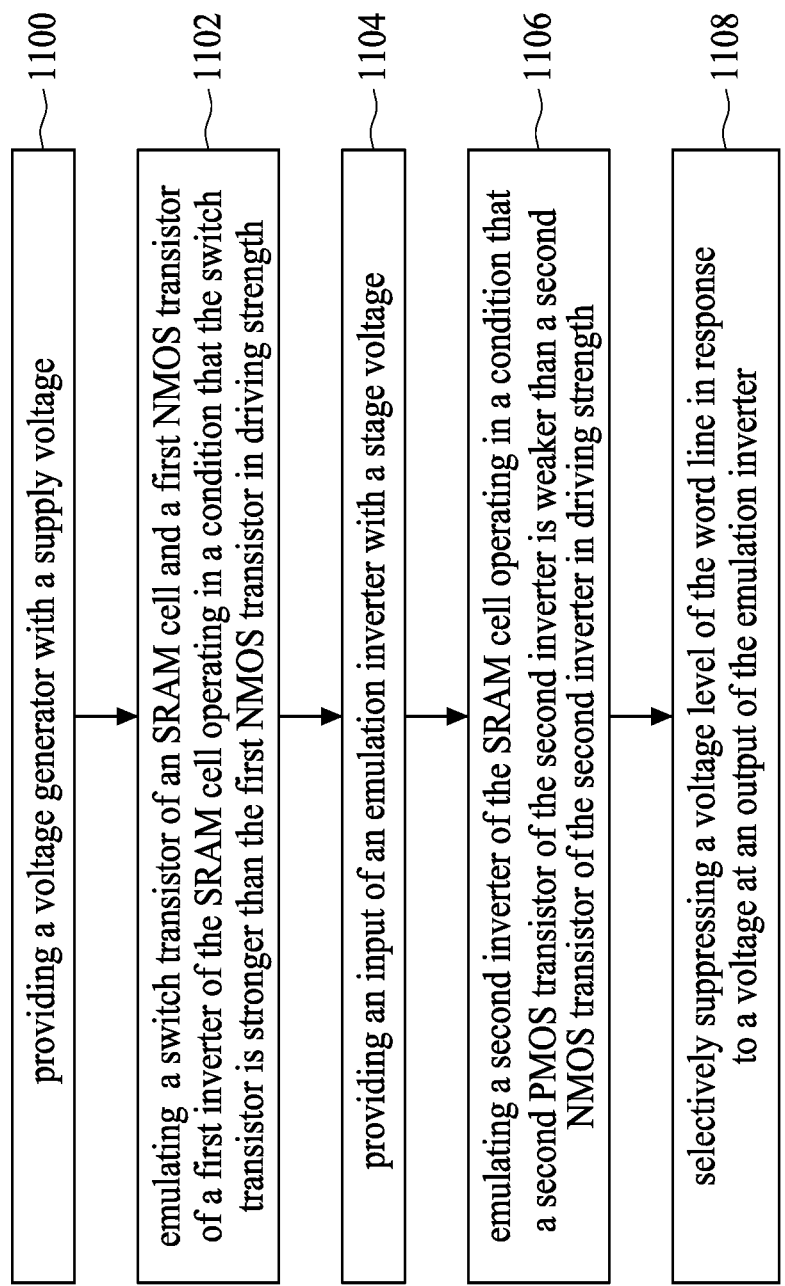
FIG. 11 is a flow chart of a method, in accordance with some embodiments.

FIG. 11 is a flow chart of a method, in accordance with some embodiments. Referring to FIG. 11, in operation 1100, a voltage generator is provided with a supply voltage.

In operation 1102, a switch transistor of an SRAM cell and a first NMOS transistor of a first inverter of the SRAM cell operating in a condition that the switch transistor is stronger than the first NMOS transistor in driving strength is emulated by the voltage generator. The switch transistor is configured to be enabled by a word line. The first inverter is formed by a first PMOS transistor and the first NMOS transistor, and stores a first data at an output of the first inverter.

In operation 1104, an input of an emulation inverter is provided with a stage voltage by the voltage generator. The stage voltage is a predetermined percentage of the supply voltage of.

In operation 1106, a second inverter of the SRAM cell operating in a condition that a second PMOS transistor of the second inverter is weaker than a second NMOS transistor of the second inverter in driving strength is emulated by the emulation inverter. The second inverter stores a second data at an output of the second inverter. A voltage level of the second data is complementary to that of the first data.

In operation 1108, a voltage level of the word line in response to a voltage at an output of the emulation inverter is selectively suppressed.

Some embodiments have one or a combination of the following features and/or advantages. In some embodiments, a semiconductor device includes an emulation inverter and a voltage generator. The emulation inverter is configured to emulate a first inverter of an SRAM cell operating in a condition that a first PMOS transistor of the first inverter is weaker than a first NMOS transistor of the first inverter in driving strength. The first inverter stores a first data at an output of the first inverter. The first PMOS transistor is configured to pull up a voltage at the output of the first inverter toward a supply voltage. The voltage generator is configured to, in response to a first logic level, provide the emulation inverter with a stage voltage. The stage voltage is a predetermined percentage of the supply voltage.

In some embodiments, a semiconductor device includes an SRAM cell, an emulator and a suppressing device. The SRAM cell, enabled by a word line, includes a first inverter formed by a first PMOS transistor and a first NMOS transistor and stores a first data at an output of the first inverter. The emulator is configured to emulate the first inverter operating in a condition that the PMOS transistor is weaker than the first NMOS transistor in driving strength. The suppressing device is configured to, in response to a voltage at an output of the emulator, selectively suppress a voltage level of the word line.

In some embodiments, a method includes the following operations. A voltage generator is provided with a supply voltage. A switch transistor of an SRAM cell and a first NMOS transistor of a first inverter of the SRAM cell operating in a condition that the switch transistor is stronger than the first NMOS transistor in driving strength is emulated by the voltage generator. A switch transistor of an SRAM cell and a first NMOS transistor of a first inverter of the SRAM cell operates in a condition that the switch transistor is stronger than the first NMOS transistor in driving strength. The switch transistor is configured to be enabled by a word line. The first inverter is formed by a first PMOS transistor and the first NMOS transistor, and stores a first data at an output of the first inverter. An input of an emulation inverter is provided with a stage voltage by the voltage generator. The stage voltage is a predetermined percentage of the supply voltage. A second inverter of the SRAM cell operating in a condition that a second PMOS transistor of the second inverter is weaker than a second NMOS transistor of the second inverter in driving strength is emulated by the emulation inverter. The second inverter stores a second data at an output of the first inverter. A voltage level of the word line is selectively suppressed in response to a voltage at an output of the emulation inverter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an emulation inverter configured to emulate a first inverter of an SRAM cell operating in a condition that a first PMOS transistor of the first inverter is weaker than a first NMOS transistor of the first inverter in driving strength, the first inverter storing a first data at an output of the first inverter, and the first PMOS transistor configured to pull up a voltage at the output of the first inverter toward a supply voltage; and
a voltage generator configured to, in response to a first logic level, provide the emulation inverter with a stage voltage, the stage voltage being a predetermined percentage of the supply voltage.

2. The semiconductor device as claimed in claim 1, wherein the voltage generator is configured to, in response to a second logic level, provide the emulation inverter with a reference voltage.

3. The semiconductor device as claimed in claim 1, wherein the voltage generator is configured to emulate a switch transistor of the SRAM cell and a second NMOS transistor of a second inverter of the SRAM cell operating in a condition that the switch transistor is stronger than the second NMOS transistor in driving strength;
the switch transistor configured to be enabled by a word line; and
the second inverter formed by a second PMOS transistor and the second NMOS transistor, and storing a second data at an output of the second inverter.

4. The semiconductor device as claimed in claim 1, wherein the emulation inverter comprises:
a high-side transistor corresponding to the first PMOS transistor; and
a low-side transistor corresponding to the first NMOS transistor, and being stronger than the high-side transistor in driving strength;
the high-side transistor and the low-side transistor having a connection node between drain terminals of each of the high-side transistor and the low-side transistor, serving as the output of the emulation inverter.

5. The semiconductor device as claimed in claim 4, wherein the low-side transistor has an aspect ratio greater than that of the high-side transistor.

6. The semiconductor device as claimed in claim 4, wherein the low-side transistor has a threshold voltage lower than that of the high-side transistor.

7. The semiconductor device as claimed in claim 1, wherein the voltage generator comprises:
a first resistive transistor corresponding to the switch transistor; and
a second resistive transistor corresponding to the second NMOS transistor, and being weaker than the first resistive transistor in driving strength; and
the first resistive transistor and the second resistive transistor having a connection node between drain terminals of each of the first resistive transistor and the second resistive transistor, the connection node having the stage voltage.

8. The semiconductor device as claimed in claim 7, wherein the first resistive transistor is configured to be not conducted in response to a second logic level, and the second resistive transistor is configured to, in response to the second logic level, provide the emulation inverter with a reference voltage.

9. The semiconductor device as claimed in claim 4, wherein the voltage generator comprises:
a first resistive transistor corresponding to the switch transistor; and
a second resistive transistor corresponding to the second NMOS transistor, and being weaker than the first resistive transistor in driving strength; and
the first resistive transistor and the second resistive transistor having a connection node between drain terminals of each of the first resistive transistor and the second resistive transistor, the connection node having the stage voltage.

10. A semiconductor device, comprising:
an SRAM cell, enabled by a word line, including a first inverter formed by a first PMOS transistor and a first NMOS transistor and storing a first data at an output of the first inverter;
an emulator configured to emulate the first inverter operating in a condition that the first PMOS transistor is weaker than the first NMOS transistor in driving strength; and
a suppressing device configured to, in response to a voltage at an output of the emulator, selectively suppress a voltage level of the word line.

11. The semiconductor device as claimed in claim 10, wherein:
the SRAM cell further includes:
a switch transistor configured to be enabled by the word line; and
a second inverter formed by a second PMOS transistor and a second NMOS transistor, and storing a second data at an output of the second inverter; and
the emulator configured to emulate the switch transistor and the second NMOS transistor operating in a condition that the switch transistor is stronger than the second NMOS transistor in driving strength.

12. The semiconductor device as claimed in claim 10, wherein:
the SRAM cell further includes:
a switch transistor configured to be enabled by the word line; and
a second inverter formed by a second PMOS transistor and a second NMOS transistor, and storing a second data at an output of the second inverter, the second PMOS transistor configured to pull up a voltage level at the output of the second inverter toward a supply voltage; and
the emulator includes:
an emulation inverter configured to emulate the first inverter operating in a condition that the first PMOS transistor is weaker than the first NMOS transistor in driving strength; an output of the emulation inverter serving as the output of the emulator; and
a voltage generator configured to, in response to a first logic level, provide an input of the emulation inverter with a stage voltage, the stage voltage being a predetermined percentage of the supply voltage.

13. The semiconductor device as claimed in claim 12, wherein the voltage generator is configured to, in response to a second logic level complementary to the first logic level, initiate a voltage at the input of the emulation inverter as a reference voltage.

14. The semiconductor device as claimed in claim 12, wherein the emulation inverter comprises:
   a high-side transistor corresponding to the first PMOS transistor; and
   a low-side transistor corresponding to the first NMOS transistor, and being stronger than the high-side transistor in driving strength,
   the high-side transistor and the low-side transistor having a connection node between drain terminals of each of the high-side transistor and the low-side transistor, serving as the output of the emulation inverter.

15. The semiconductor device as claimed in claim 14, wherein the low-side transistor has an aspect ratio greater than that of the high-side transistor.

16. The semiconductor device as claimed in claim 14, wherein the low-side transistor has a threshold voltage lower than that of the high-side transistor.

17. The semiconductor device as claimed in claim 12, wherein the voltage generator comprises:
   a first resistive transistor; and
   a second resistive transistor, being weaker than the first resistive transistor in driving strength,
   the first resistive transistor and the second resistive transistor having a connection node between drain terminals of each of the first resistive transistor and the second resistive transistor, the connection node having the stage voltage.

18. The semiconductor device as claimed in claim 17, wherein the first resistive transistor is configured to be not conducted in response to a second logic level, and the second resistive transistor is configured to, in response to the second logic level, initiate a voltage at the input of the emulation inverter as a reference voltage.

19. The semiconductor device as claimed in claim 14, wherein the voltage generator comprises:
   a first resistive transistor corresponding to the switch transistor; and
   a second resistive transistor corresponding to the second NMOS transistor, and being weaker than the first resistive transistor in driving strength,
   the first resistive transistor and the second resistive transistor having a connection node between drain terminals of each of the first resistive transistor and the second resistive transistor, the connection node having the stage voltage.

20. A method, comprising:
   providing a voltage generator with a supply voltage;
   emulating, by the voltage generator, a switch transistor of an SRAM cell and a first NMOS transistor of a first inverter of the SRAM cell operating in a condition that the switch transistor is stronger than the first NMOS transistor in driving strength, the switch transistor configured to be enabled by a word line, and the first inverter formed by a first PMOS transistor and the first NMOS transistor, and storing a first data at an output of the first inverter;
   providing, by the voltage generator, an input of an emulation inverter with a stage voltage, the stage voltage being a predetermined percentage of the supply voltage;
   emulating, by the emulation inverter, a second inverter of the SRAM cell operating in a condition that a second PMOS transistor of the second inverter is weaker than a second NMOS transistor of the second inverter in driving strength, the second inverter storing a second data at an output of the first inverter; and
   selectively suppressing a voltage level of the word line in response to a voltage at an output of the emulation inverter.

\* \* \* \* \*